United States Patent
Sankarasubramanian et al.

(10) Patent No.: US 11,335,616 B2
(45) Date of Patent: May 17, 2022

(54) SUBSTRATE INTEGRATED INDUCTOR WITH COMPOSITE MAGNETIC RESIN LAYER

(71) Applicant: Intel Corporation, Santa Clara, CA (US)

(72) Inventors: Malavarayan Sankarasubramanian, Chandler, AZ (US); Yongki Min, Phoenix, AZ (US); Ashay A. Dani, Chandler, AZ (US); Kaladhar Radhakrishnan, Chandler, AZ (US)

(73) Assignee: Intel Corporation, Santa Clara, CA (US)

( * ) Notice: Subject to any disclaimer, the term of this patent is extended or adjusted under 35 U.S.C. 154(b) by 70 days.

(21) Appl. No.: 16/498,775

(22) PCT Filed: Apr. 28, 2017

(86) PCT No.: PCT/US2017/030182
§ 371 (c)(1),
(2) Date: Sep. 27, 2019

(87) PCT Pub. No.: WO2018/199990
PCT Pub. Date: Nov. 1, 2018

(65) Prior Publication Data
US 2021/0098326 A1   Apr. 1, 2021

(51) Int. Cl.
*H01L 23/31* (2006.01)
*H01L 23/498* (2006.01)
*H01L 23/522* (2006.01)

(52) U.S. Cl.
CPC .... *H01L 23/3128* (2013.01); *H01L 23/49822* (2013.01); *H01L 23/5227* (2013.01)

(58) Field of Classification Search
CPC ........... H01L 23/3128; H01L 23/49822; H01L 23/5227; H01L 28/10
(Continued)

(56) References Cited

U.S. PATENT DOCUMENTS

| | | | |
|---|---|---|---|
| 2002/0003281 A1* | 1/2002 | Ibata | H01G 4/40 257/531 |
| 2003/0077871 A1* | 4/2003 | Cheng | H01L 24/19 438/381 |

(Continued)

OTHER PUBLICATIONS

International Search Report and Written Opinion received in PCT/US2017/030182, dated Jan. 26, 2018, 14 pages.
(Continued)

*Primary Examiner* — Robert T Huber
(74) *Attorney, Agent, or Firm* — Schwabe, Williamson & Wyatt, P.C.

(57) ABSTRACT

A semiconductor package may include a composite magnetic inductor that is formed integral with the semiconductor substrate. The composite magnetic inductor may include a composite magnetic resin layer and a plurality of conductive layers arranged such that the composite magnetic resin layer is interleaved between successive conductive layers. The resultant composite magnetic inductor may be disposed between dielectric layers. A core layer may be disposed proximate the composite magnetic inductor. A build-up layer may be disposed proximate the core layer or proximate the composite magnetic inductor in a coreless semiconductor substrate. A semiconductor die may couple to the build-up layer. The composite magnetic inductor beneficially provides a greater inductance than external inductors coupled to the semiconductor package.

25 Claims, 6 Drawing Sheets

(58) Field of Classification Search
USPC .......... 257/531, E21.022, E27.113; 438/381
See application file for complete search history.

(56) References Cited

U.S. PATENT DOCUMENTS

| | | |
|---|---|---|
| 2006/0289976 A1 | 12/2006 | Min |
| 2008/0137314 A1 | 6/2008 | Salama et al. |
| 2013/0223033 A1 | 8/2013 | Mano et al. |
| 2014/0034373 A1 | 2/2014 | Yoshikawa et al. |
| 2014/0159850 A1 | 6/2014 | Roy et al. |

OTHER PUBLICATIONS

International Preliminary Report on Patentability received in PCT/US2017/030182, dated Nov. 7, 2019, 11 pages.

* cited by examiner

SUBSTRATE INTEGRATED INDUCTOR WITH COMPOSITE MAGNETIC RESIN LAYER

CROSS-REFERENCE TO RELATED APPLICATIONS

This present application is a National Phase Application Filed Under 35 U.S.C. 371 claiming priority to PCT/US2017/030182 filed Apr. 28, 2017, the entire disclosure of which is incorporated herein by reference.

TECHNICAL FIELD

The present disclosure relates to technologies for fabricating semiconductor substrates.

BACKGROUND

With the decreasing size and increasing performance of processor-based electronic devices, significant pressure has been placed on manufacturers to integrate components wherever possible to reduce cost and to free up valuable space on system motherboards. One such method of reducing costs and freeing motherboard space is to piggyback as many formerly discrete components as possible onto the central processing unit (CPU) package. One such component is the CPU voltage regulator. The CPU voltage regulator includes one or more inductive elements. Typically, such inductive elements have been separate components that are coupled to either the CPU package itself or in a void or similar recessed area at least partially beneath the CPU package. Such an arrangement provides a limited solution since CPU architecture effectively limits the size and placement of the inductive elements. Limiting the size and placement of the inductive elements limits design flexibility and inductor performance. With a growing emphasis being placed on low profile package and server package architectures, the placement of the voltage regulator inductors beneath the CPU package has typically been viewed as a design disadvantage.

BRIEF DESCRIPTION OF THE DRAWINGS

Features and advantages of various embodiments of the claimed subject matter will become apparent as the following Detailed Description proceeds, and upon reference to the Drawings, wherein like numerals designate like parts, and in which:

Figure 1:
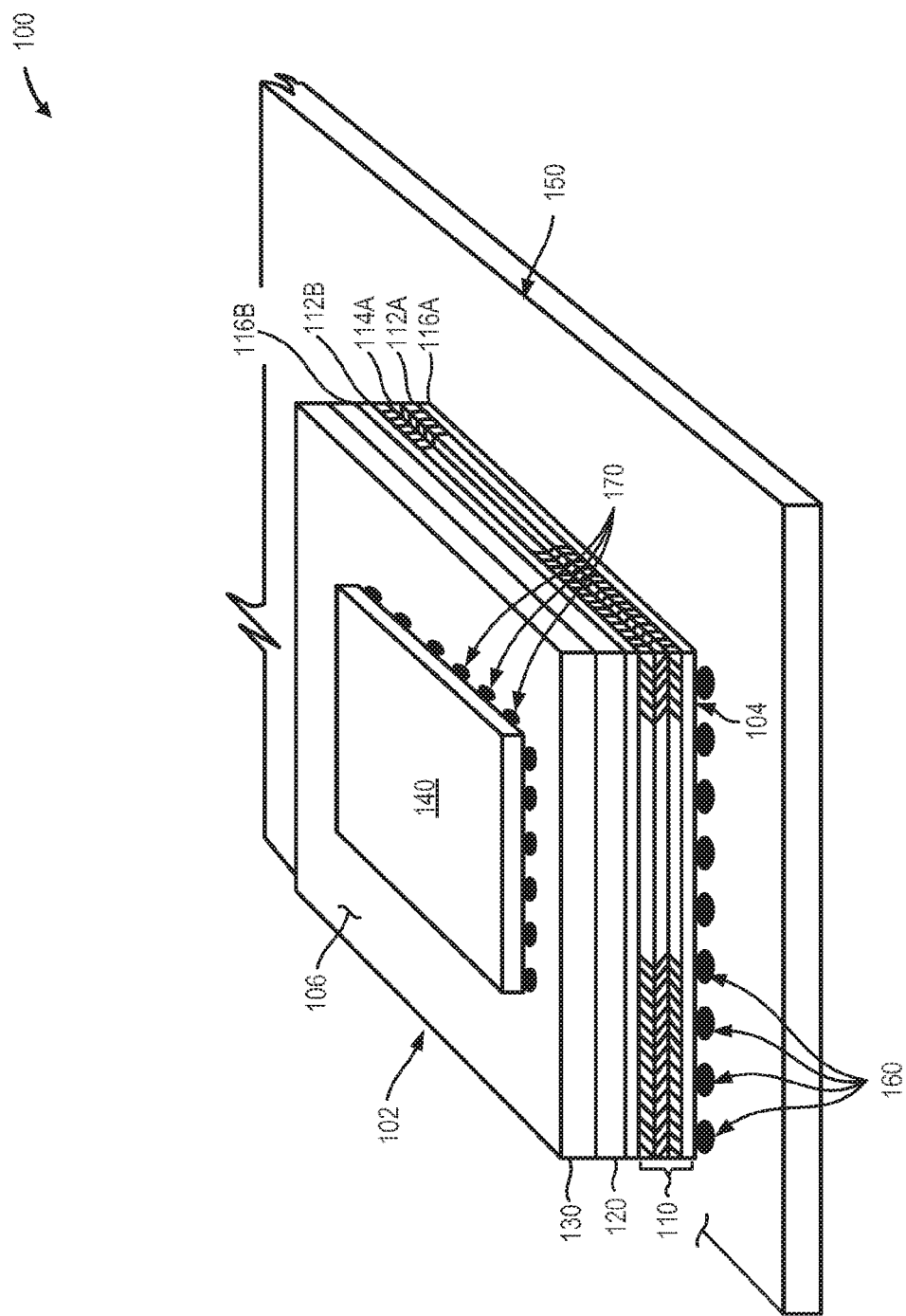
FIG. 1 is a perspective view of an illustrative system in which an example semiconductor substrate includes a composite magnetic inductor, a core, and a top built-up layer, in accordance with at least one embodiment described herein.

Although the following Detailed Description will proceed with reference being made to illustrative embodiments, many alternatives, modifications and variations thereof will be apparent to those skilled in the art.

DETAILED DESCRIPTION

The systems, methods, and apparatuses disclosed herein provide an inductor that includes a magnetic composite resin integrated directly into the substrate build up. This high-performance inductor may be fabricated during the substrate manufacturing process by selectively depositing the composite magnetic material instead of the more conventional dielectric materials between conductive layers during the substrate buildup process.

Inductors used for voltage regulation in processor-based systems include aircore inductors (ACIs) that are fabricated as copper layers in the package core buildup during the manufacturing process. As die area scales by generation, ACI may also be scaled, however as ACI scales, inductor performance tends to decrease. The loss in ACI scalability for increasing package sizes provides a strong indication that a scalable, cost effective solution for voltage regulator inductors in a semiconductor package environment is of increasing importance. The systems, methods, and apparatuses described herein fabricate voltage regulator inductors using magnetic composite resins during the substrate manufacturing process. In the systems, methods, and apparatuses disclosed herein, a magnetic composite material is substituted for at least a portion of the dielectric material traditionally inserted between copper layers in the substrate buildup process. The substitution of the magnetic composite resin for the dielectric material effectively integrates the inductor into the substrate itself rather than requiring the use of an external inductor. The use of the magnetic composite resin in lieu of the dielectric beneficially and advantageously: reduces cost; integrates with existing substrate manufacturing processes; and permits the use of larger, more efficient inductors that can assume shapes complimentary with other substrate components.

A semiconductor substrate is provided. The semiconductor substrate may include: at least one composite magnetic inductor that may include: at least one composite magnetic resin layer; a plurality of conductive layers disposed on opposite side of the at least one magnetic resin layer; where the at least one magnetic resin layer and the plurality of conductive layers are interleaved to provide the at least one composite magnetic inductor in which the at least one composite magnetic resin layer alternates with the plurality of conductive layers.

A motherboard is provided. The motherboard may include: a semiconductor package communicably coupled to the motherboard, the semiconductor package having at least one composite magnetic inductor that includes: at least one composite magnetic resin layer; and a plurality of conductive layers disposed on opposite side of the at least one composite magnetic resin layer; where the at least one magnetic resin layer and the plurality of conductive layers are interleaved to provide the at least one composite magnetic inductor, the at least one composite magnetic inductor including alternating conductive layers and composite magnetic resin layers.

A method of forming a composite magnetic inductor in a semiconductor substrate is provided. The method may include: depositing a plurality of conductive layers within the semiconductor substrate; and depositing a composite magnetic resin layer between each of at least some of the conductive layers included in the plurality of conductive layers to provide the composite magnetic inductor in which the composite magnetic resin layer alternates with the conductive layer.

A system to form a composite magnetic inductor in a semiconductor substrate is provided. The system may include: means for depositing a plurality of conductive layers within the semiconductor substrate; and means for means for depositing a composite magnetic resin layer between each of at least some of the conductive layers included in the plurality of conductive layers to provide the composite magnetic inductor in which the composite magnetic resin layer alternates with the conductive layer.

As used herein the terms "top," "bottom," "lowermost," and "uppermost" when used in relationship to one or more elements are intended to convey a relative rather than absolute physical configuration. Thus, an element described as an "uppermost element" or a "top element" in a device may instead form the "lowermost element" or "bottom element" in the device when the device is inverted. Similarly, an element described as the "lowermost element" or "bottom element" in the device may instead form the "uppermost element" or "top element" in the device when the device is inverted.

As used herein, the term "logically associated" when used in reference to a number of objects, systems, or elements, is intended to convey the existence of a relationship between the objects, systems, or elements such that access to one object, system, or element exposes the remaining objects, systems, or elements having a "logical association" with or to the accessed object, system, or element. An example "logical association" exists between relational databases where access to an element in a first database may provide information and/or data from one or more elements in one or more additional databases, each having an identified relationship to the accessed element. In another example, if "A" is logically associated with "B," accessing "A" will expose or otherwise draw information and/or data from "B," and vice-versa.

As used herein, the term "motherboard" is used in a relative rather than absolute sense in that the "motherboard" refers to the substrate to which a semiconductor package is attached. Thus, the "motherboard" may, in some instances, include a true motherboard in the sense that a central processing unit is communicably coupled to the substrate. In other instances, the "motherboard" may include any substrate to which the semiconductor package is attached, including, but not limited to, daughter boards, peripheral boards, graphics cards, and similar.

FIG. 1 is a perspective view of an illustrative system 100 in which an example semiconductor substrate 102 includes a composite magnetic inductor 110, a core 120, and a top built-up layer 130, in accordance with at least one embodiment described herein. As depicted in FIG. 1, the composite magnetic inductor 110 may include at least one composite magnetic resin layer 112A-112n (collectively "composite magnetic resin layers 112") and a plurality of conductive layers 114A-114n (collectively "conductive layers 114"). Each of the composite magnetic resin layers 112 is interleaved between conductive layers 114 to form a composite magnetic inductor 110 having a laminated structure in which composite magnetic resin layers 112 and conductive layers 114 are alternatingly stacked. In embodiments, the composite magnetic inductor 110 may include a lower dielectric layer 116A and an upper dielectric layer 116B.

In some implementations, the semiconductor substrate 102 may be used to communicably couple a die 140, such as a processor or central processing unit (CPU), to a motherboard 150. In embodiments, the semiconductor substrate 102 may include a first communication interface, such as ball grid array 160 disposed on a first (e.g., lower) surface 104 of the semiconductor substrate 102, that is used to communicably couple the semiconductor substrate 102 to the motherboard 150. In embodiments, the semiconductor substrate 102 may include a second communication interface, such as a plurality of lands to accommodate a ball grid array 170 disposed on the die 140 above a second (e.g., upper) surface 106 of the semiconductor substrate 102, that is used to communicably couple the die 140 to the semiconductor substrate 102.

In implementations, the composite magnetic inductor 110 forms at least a portion of the power distribution system that supplies power to the die 140 and/or other components, devices, or systems coupled to the motherboard 150. For example, the composite magnetic inductor 110 may form a portion of a voltage regulator coupled to a power supply for the die 140. Integrating the composite magnetic inductor 110 into the semiconductor substrate 102 beneficially and advantageously eliminates the need for an external inductor coupled to the confined area between the semiconductor substrate 102 and the motherboard 150. The design and performance advantages of the composite magnetic inductor 110 over conventional inductors include, but are not limited to: increased inductor performance due to design flexibility and lower transmission distances; reduced manufacturing costs since the composite magnetic inductor 110 is formed during the relatively inexpensive substrate manufacturing process; improved reliability over an attached discrete inductor; and reduced development time to implement new inductor sizes, configurations, and/or technologies.

The semiconductor substrate 102 may include a core layer 120. In embodiments, the core layer 120 may include a structural member such as a member containing glass fibers mixed with an epoxy resin. The semiconductor substrate 102 includes a top built-up layer 130 that may include at least one conductive layer and at least one dielectric layer that form any number of hardwire interconnects that communicably couple a semiconductor die 140 positioned on a first surface (e.g., the "top") of the semiconductor substrate 102 to a motherboard 150 disposed proximate a second surface (i.e., the "bottom") of the semiconductor substrate 102.

The composite magnetic inductor 110 includes alternating composite magnetic resin layers 112 and conductive layers 114. Although only one composite magnetic resin layer 112A and two conductive layers 114A and 114B are depicted in FIG. 1, any number of alternating composite magnetic resin layers 112A-112n and conductive layers 114A-114n may be similarly arranged.

Each composite magnetic resin layer 112 includes one or more magnetic materials disposed, suspended, or otherwise dispersed in a resin carrier. Each composite magnetic resin layer 112 may have a thickness of from: about 10 micrometers (μm) to about 50 μm; about 10 μm to about 100 μm; about 10 μm to about 150 μm; about 10 μm to about 200 μm; about 10 μm to about 250 m; about 10 μm to about 300 μm; about 10 μm to about 400 μm; or about 10 μm to about 500 m. The magnetic material may have a concentration in the resin carrier of from: about 20 volume percent (vol %) to about 25 vol %; about 20 vol % to about 30 vol %; about 20 vol % to about 35 vol %; about 20 vol % to about 40 vol %; about 20 vol % to about 45 vol %; about 20 vol % to about 50 vol %; about 20 vol % to about 60 vol %; about 20 vol % to about 70 vol %; about 20 vol % to about 80 vol %; about 20 vol % to about 90 vol %; or about 20 vol % to about 95 vol %.

The magnetic materials included in the composite magnetic resin layer 112 include, but are not limited to: one or more metallic magnetic materials or one or more soft ferrite magnetic materials. Example metallic magnetic materials include, but are not limited to: iron (Fe); oriented iron silicide (FeSi); unoriented iron silicide (FeSi); iron-nickel (FeNi) and iron nickel containing alloys; iron-cobalt (FeCo) and iron-cobalt containing alloys; FeSiBNbCu and FeSiBNbCu containing alloys; and CoZrTa and CoZrTa containing alloys. Example soft ferrite magnetic materials include, but are not limited to: manganese-zinc ferrite (MnZn); nickel-zinc ferrite (NiZn); and ferric oxide ($Fe_2O_3$). Soft ferrites have a relatively low coercivity which permits the magnetic field produced by a soft ferrite to easily reverse without hysteresis losses (i.e., energy dissipation). The relatively low losses of soft ferrite materials at high frequencies provides an advantage in both radio frequency (RF) applications and switched-mode power supplies. In embodiments, one or more organic and/or inorganic coatings may be applied to at least a portion of the magnetic materials used in the composite magnetic resin layer 112, such coatings beneficially increase the surface resistivity of at least a portion of the magnetic materials used in the composite magnetic resin layer 112.

The resin carrier included in the composite magnetic resin layer 112 include, but are not limited to: thermosetting resins, such as epoxies; inter-penetrating polymer networks; liquid crystalline polymers (LCP); fluoropolymers, such as polytetrafluoroethylene (PTFE); and silicones. In one embodiment, the resin carrier included in the composite magnetic resin layer 112 may include bis-benzocyclobutene (BCB, for example bis-benzocyclobutene offered under the commercial name CYCLOTENE™ 3022 by Dow Chemical Co., MIDLAND, Mich.). In some embodiments, a liquid crystalline polymer may include one or more polymers dissolved in one or more solvents (e.g., lyotropic liquid-crystal polymers). In some embodiments, a liquid crystalline polymer may include one or more polymers or polymer mixtures heated above its glass or melting transition point (e.g., thermotropic liquid-crystal polymers). The composite magnetic resin layer 112 may be applied, deposited, or otherwise formed using any number and/or combination of currently available and/or future developed liquid application techniques including spray deposition, spin coating, printing, and similar.

Each of the conductive layers 114 may include one or more metallic or non-metallic, electrically conductive, materials. Each of the conductive layers 114 may be patterned, formed, or otherwise deposited across all or a portion of either the dielectric layer 116 or the composite magnetic resin layer 112. Each of the conductive layers 114 may have a thickness of from about 5 micrometers (μm) to about 10 μm; about 5 μm to about 20 μm; about 5 μm to about 30 μm; about 5 μm to about 50 μm; about 5 μm to about 75 m; or about 5 μm to about 100 m.

In embodiments, the alternating composite magnetic resin layers 112 and conductive layers 114 create a composite magnetic inductor 110 in the form of a laminated "stack" having a first (e.g., top) surface and a second (e.g., bottom) surface. In embodiments, a first dielectric layer 116A may be disposed proximate at least a portion of the first surface of the of the composite magnetic inductor 110. In embodiments, a second dielectric layer 116B may be disposed proximate at least a portion of the second surface of the composite magnetic inductor 110.

The composite magnetic inductor 110 may be used in cored or coreless semiconductor substrates 102. In cored semiconductor substrates 102, the core 120 may be disposed proximate at least a portion of the composite magnetic inductor 110. In coreless semiconductor substrates 102, the top built-up layer 130 may be disposed proximate at least a portion of the composite magnetic inductor 110.

Figure 2:
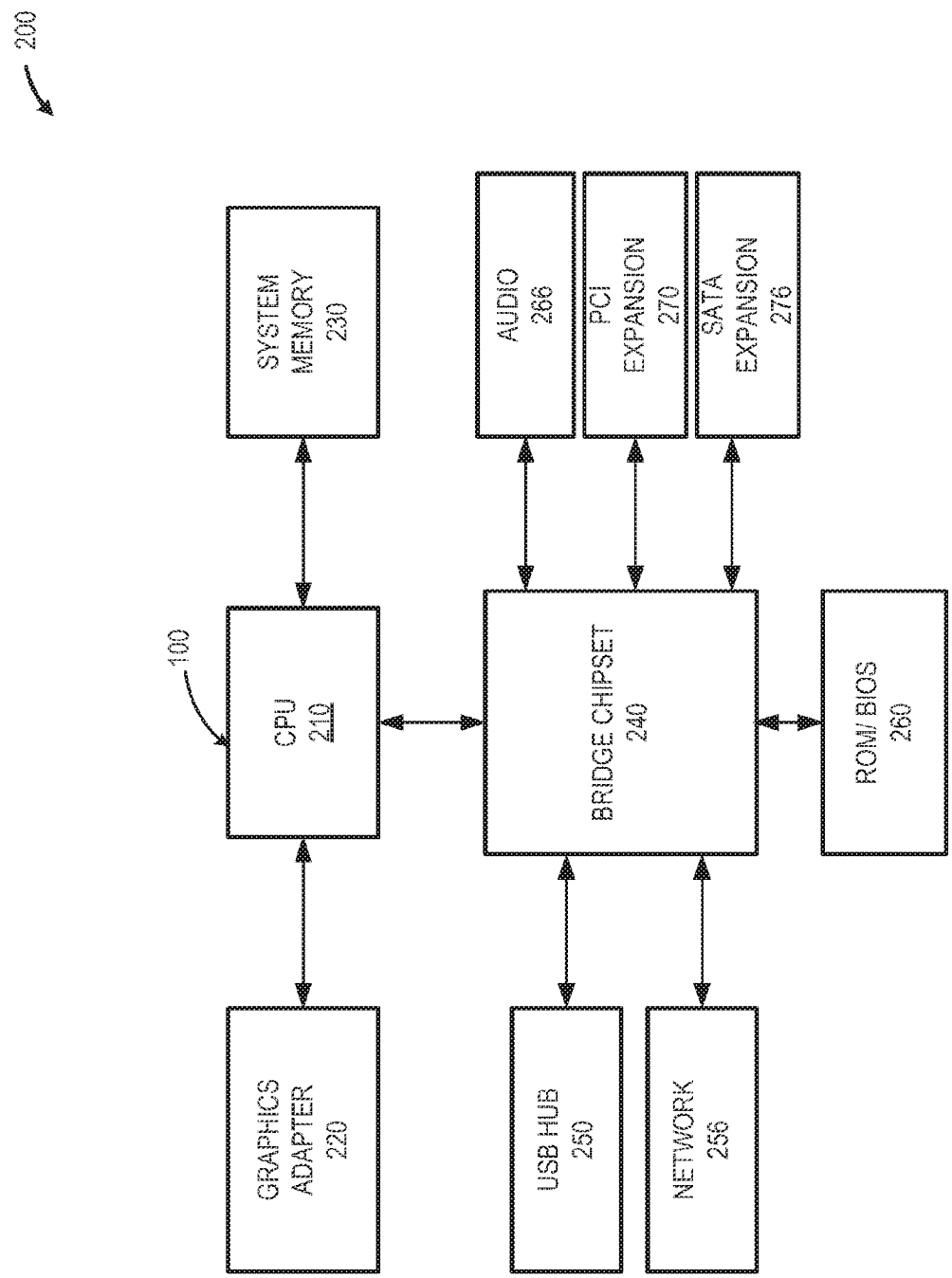
FIG. 2 is a block diagram of an illustrative system that includes a central processing unit (CPU) formed using a semiconductor substrate that includes one or more components, such as a voltage regulator, that includes a composite magnetic inductor as described in detail in FIG. 1, in accordance with at least one embodiment described herein.

FIG. 2 is a block diagram of an illustrative system 200 that includes a central processing unit (CPU) 210 formed using a semiconductor substrate 102 that includes one or more components, such as a voltage regulator, that includes a composite magnetic inductor 110 as described in detail in FIG. 1, in accordance with at least one embodiment described herein. In embodiments, the CPU 210 communicably couples to a graphics adapter 220, system memory 230, and a bridge chipset 240. The bridge chipset 240 communicably couples to various external and input/output devices including: a universal serial bus (USB) hub 250, one or more wired or wireless network adapters 256, a read only memory 260 that contains a basic input/output system (BIOS), an audio adapter 266, a peripheral component interconnect (PCI/PCI-e) expansion hub 270, and/or a serial AT attachment (SATA/eSATA) expansion hub 276.

The CPU 210 may include any number of cores, processing units, or similar logical processing units capable of executing one or more machine-executable instruction sets. In embodiments, the CPU 210 may include one or more semiconductor dies 140 communicably coupled to one or more semiconductor substrates 102 such as depicted and described in FIG. 1. In some implementations, the semiconductor substrates 102 may include one or more composite magnetic inductor 110 communicably coupled to a power supply or power distribution system or network that distributes power to the CPU 210 and may distribute power to one or more devices or components external to the CPU 210.

The CPU 210 may include any number, type, or combination of devices. At times, the processor circuitry 120 may be implemented in whole or in part in the form of semiconductor devices such as diodes, transistors, inductors, capacitors, and resistors. Such an implementation may include, but is not limited to any current or future developed single- or multi-core processor or microprocessor, such as: on or more systems on a chip (SOCs); central processing units (CPUs); digital signal processors (DSPs); graphics processing units (GPUs); application-specific integrated circuits (ASICs), field programmable gate arrays (FPGAs), and the like. Example processor circuitry may include, but is not limited to, single- and multi-core processors and microprocessors such as: Intel® Pentium® series processors; Intel® Xeon® series coprocessors; Intel® Core® series processors; Intel® Core2® series processors; Intel® Celeron series processors; Apple® A series processors; and similar. Unless described otherwise, the construction and operation of the various blocks shown in FIG. 2 are of conventional design. As a result, such blocks need not be described in further detail herein, as they will be understood by those skilled in the relevant art. The communications links that communicably couple the blocks depicted in FIG. 2 may include one or more serial and/or parallel buses that employ any known serial or parallel bus structures or architectures.

The system 200 may include one or more graphics adapters 220 that receive data from one or more system components and convert the data for display on a communicably coupled display device such as a liquid crystal display (LCD) monitor or touchscreen; or a light emitting diode (LED) monitor or touchscreen. The one or more graphics adapters 200 may include one or more graphics processing units (GPUs). In embodiments, one or more of the GPUs may be fabricated using a semiconductor die 140 communicably coupled to a semiconductor substrate 102 that includes a composite magnetic inductor 110. In some implementations, the composite magnetic inductor 110 may be communicably coupled to a power supply or power distribution network that provides power to the one or more graphics adapters 220. In some implementations, the composite magnetic inductor 110 may be communicably coupled to a power supply or power distribution network that provides power one or more devices, components, or systems external to the graphics adapter 220.

The system 200 may include system memory 230. The system memory 230 may include any number and/or combination of devices, systems, or combinations thereof suitable for at least the temporary storage of data by the CPU 210. The system memory 230 may include random access memory (RAM), dynamic random access memory (DRAM), programmable read only memory (PROM), erasable programmable read only memory (EPROM), electrically erasable programmable read-only memory (EEPROM), static random access memory (SRAM), double data rate memory (DDR/DDR2/DDR3/DDR4)), or combinations thereof. The system memory 230 may have any storage capacity (2 megabytes (MB), 100 MB, 500 MB, 1 gigabyte (GB), 100 GB, 500 GB, 1 terabyte (TB), 5 TB, 10 TB, 50 TB, etc.).

The system 200 may include one or more bridge chipsets 240 capable of facilitating the exchange of data between the CPU 210 and one or more peripheral devices, networks, hubs, or similar. A non-limiting example of a bridge chipset includes the Intel® Express Chipset as offered by Intel Corp., SANTA CLARA, Calif.). In some implementations, the bridge chipset 240 may be analogized to a "translator" that receives information and/or data in a first format and converts the information and/or data to a second format. For example, the bridge chipset 240 may receive information and/or data from a network connected device that is in a first format unreadable by the CPU 210. In such an instance, the bridge chipset 240 may translate the information and/or data to a second format compatible with the CPU prior to communicating the information to the CPU 210.

The bridge chipset 240 communicably couples to various external and input/output devices including: a universal serial bus (USB) hub 250, one or more wired or wireless network adapters 256, a read only memory 260 that contains a basic input/output system (BIOS), an audio adapter 266, a peripheral component interconnect (PCI/PCI-e) expansion hub 270, and/or a serial AT attachment (SATA/eSATA) expansion hub 276.

The USB hub 250 may include any number and/or combination of systems and/or devices capable of bidirectionally communicating information and/or data between one or more external devices (e.g., I/O devices, sensors, network adapters, memory devices) and the bridge chipset 240. In some implementations, the USB hub 250 may include one or more semiconductor dies 140 communicably coupled to a semiconductor substrate 102 that includes a composite magnetic inductor 110. In such an instance, the composite magnetic inductor 110 may be communicably coupled to one or more power supplies and/or distribution networks capable of providing power to an external device via the USB interface.

The network adapter 256 may include one or more wired and/or one or more wireless network adapters 256. Example wireless network adapters 256 include, but are not limited to, one or more: IEEE 802.11 (Wi-Fi®) compatible adapters; BLUETOOTH® adapters; near field communication (NFC) adapters; cellular adapters; and similar. Example wired adapters 256 include, but are not limited to, one or more: IEEE 802.3 (Ethernet) adapters.

The read-only memory ("ROM") 260 may include any number and/or combination of non-volatile storage devices capable of storing information and/or data. Such information and/or data may include basic input/output system ("BIOS") data. A portion of the ROM 260 may be used to store or otherwise retain a basic input/output system. The BIOS provides basic functionality to the system 200, for example by causing the CPU 210 to load one or more machine-readable instruction sets upon initial system power-up or after a soft or hard system reset.

The audio adapter 266 may include any number and/or combination of devices, systems, or combinations thereof capable of generating an audio output perceptible to the system user. In some implementations, the audio adapter 266 may include one or more audio output devices, such as an internal or external loudspeaker system. In some implementations, the audio adapter 266 may include one or more stereo output jacks, RCA jacks, or similar audio output interfaces.

A peripheral component interconnect (PCI/PCI-e) expansion hub 270 may include one or more devices, systems, or components capable of accepting the communicable coupling of one or more internal or external peripheral devices that include a PCI/PCIe interface. A serial AT attachment (SATA/eSATA) expansion hub 276 may include one or more devices, systems, or components capable of accepting the communicable coupling of one or more internal or external peripheral devices that include a SATA/eSATA interface.

Figure 3:
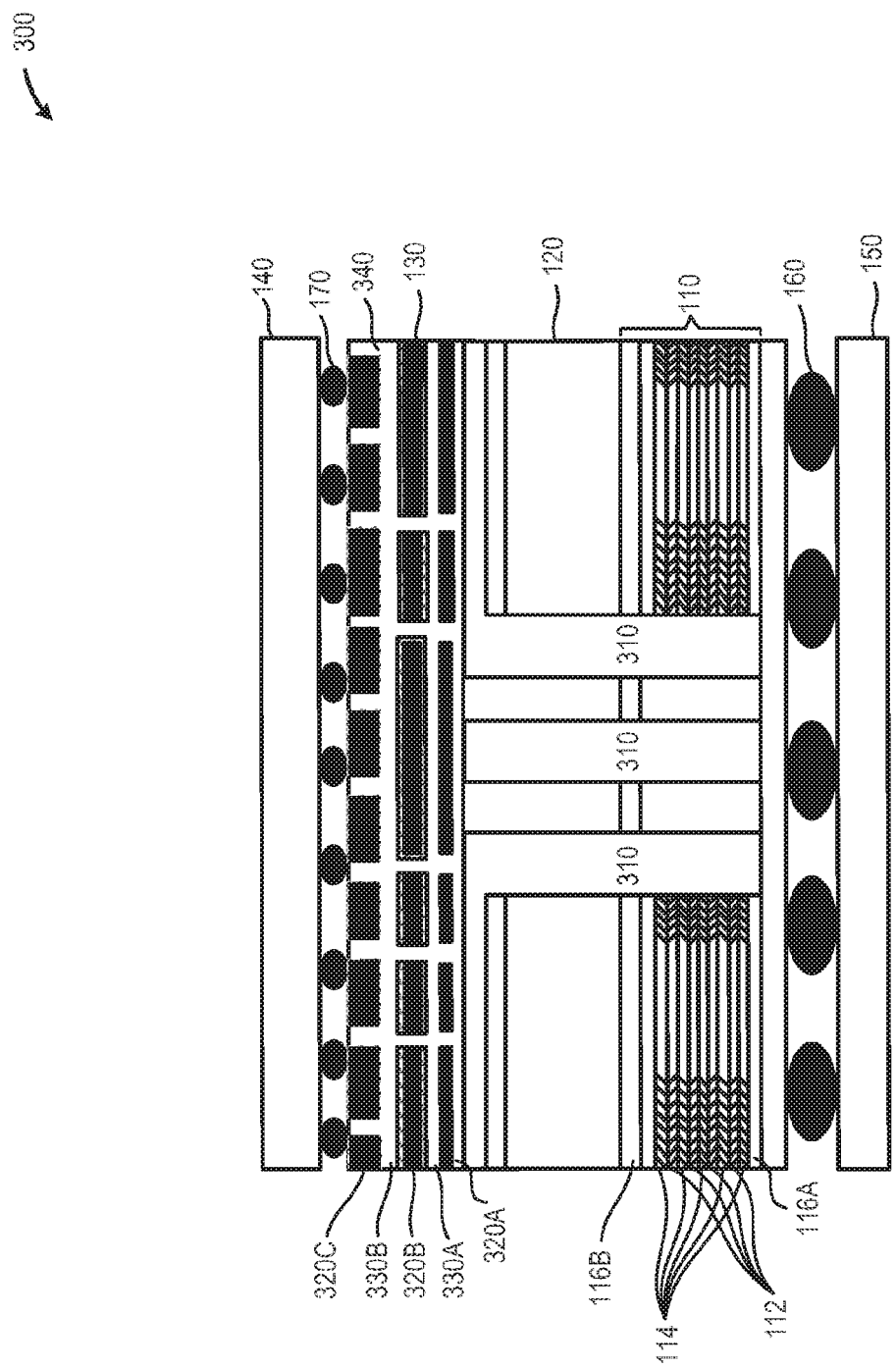
FIG. 3 is a cross-sectional elevation of an illustrative cored semiconductor package that includes a composite magnetic inductor, a core, and an upper build-up layer, in accordance with at least one embodiment described herein.

FIG. 3 is a cross-sectional elevation of an illustrative cored semiconductor package 300 that includes a composite magnetic inductor 110, a core 120, and an upper build-up layer 130, in accordance with at least one embodiment described herein. As depicted in FIG. 3, the composite magnetic inductor 110 includes four composite magnetic resin layers 112 and five conductive layers 114. Also, as depicted in FIG. 3, the upper built-up layer 130 includes three dielectric layers 320A-320C (collectively, "dielectric layers 320") and two conductive layers 330A and 330B (collectively, "conductive layers 330").

In embodiments, one or more vias 310 may communicably couple the upper built-up layer 130 to the ball grid array 160 communicably coupling the semiconductor substrate 102 to the motherboard 150. The upper built-up layer 130 includes a plurality of conductive traces or similar structures and may also include one or more vias that penetrate through the dielectric layers 320 and communicably couple different structures on different conductive layers 330. One or more lands 340 may communicably couple the upper built-up layer 130 to the semiconductor die 140. In some implementations, a ball grid array 170 may communicably couple the semiconductor die 140 to the lands 340 on the upper built-up layer 130.

Figure 4:
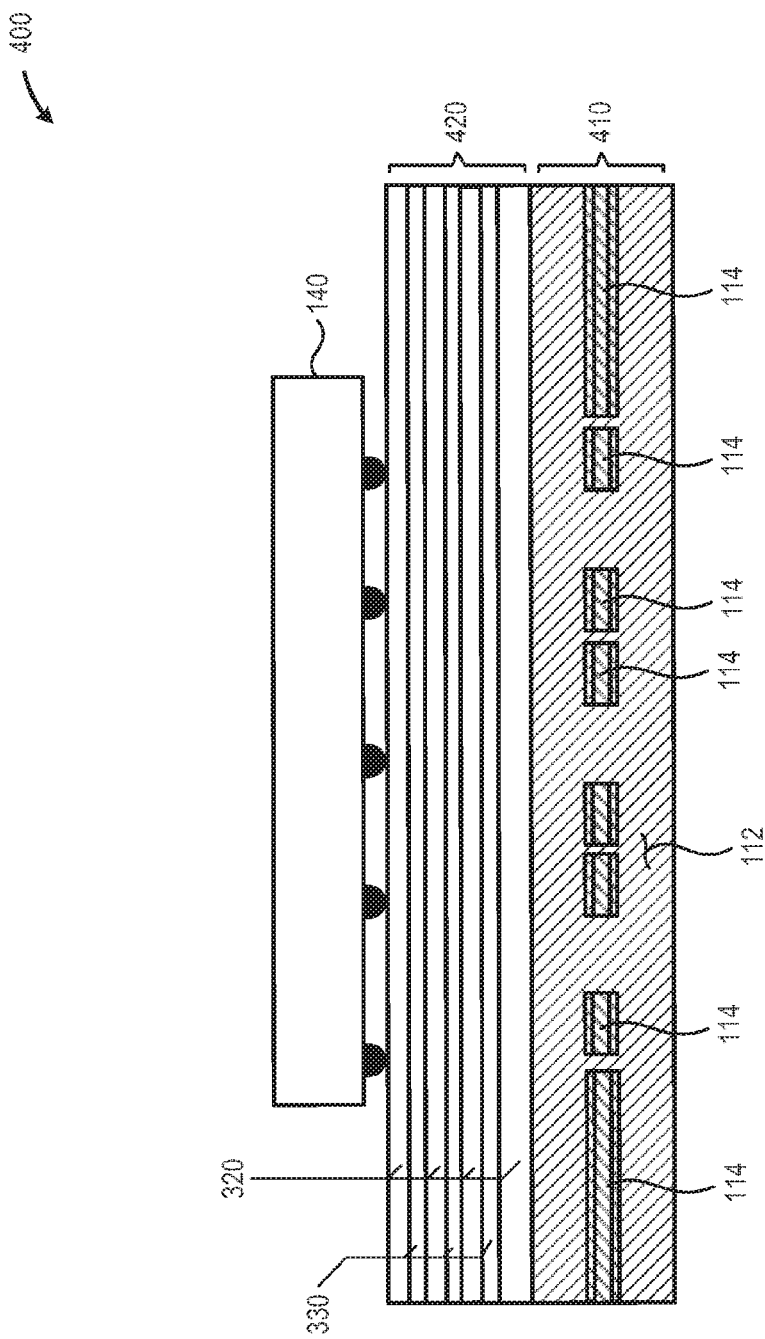
FIG. 4 is a cross-sectional elevation of an illustrative coreless semiconductor package that includes a composite magnetic inductor and an upper built-up layer, in accordance with at least one embodiment described herein.

FIG. 4 is a cross-sectional elevation of an illustrative coreless semiconductor package 400 that includes a composite magnetic inductor 410 and an upper built-up layer 420, in accordance with at least one embodiment described herein. The coreless semiconductor package 400 typically employs a fine pitch ball grid array attachment to the motherboard 150. Ah fine pitch ball grid array limits the available space for the communicable coupling of an external inductor. Thus, the use of a composite magnetic inductor 410 such as depicted in FIG. 4 beneficially permits the use of an inductor having a higher inductance than is typically possible using an external inductor communicably coupled to the coreless semiconductor package 400. As depicted in FIG. 4, the semiconductor die 140 is communicably coupled to the upper built-up layer 420. The composite magnetic inductor 110 includes a built-up magnetic inductor using a magnetic composite sheet inductor.

Figure 5:
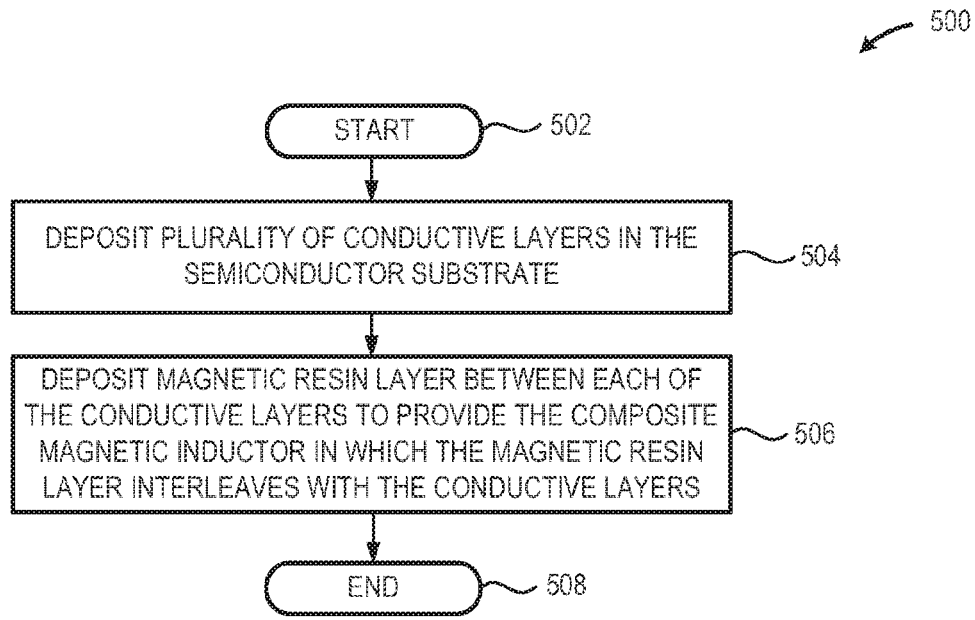
FIG. 5 is a high-level logic flow diagram of an illustrative semiconductor substrate manufacturing method in accordance with at least one embodiment described herein.

FIG. 5 is a high-level logic flow diagram of an illustrative semiconductor substrate manufacturing method 500 in accordance with at least one embodiment described herein. In embodiments, a composite magnetic inductor 110 may be used in a semiconductor package 100 in place of one or more externally coupled inductors. Such an arrangement beneficially and advantageously permits the integration in the semiconductor substrate 102 of an inductor having a greater inductance than externally coupleable inductors. In embodiments, the composite magnetic inductor 110 may include alternating composite magnetic resin layers 112 and conductive layers 114 patterned directly in the semiconductor substrate 102. The method 500 commences at 502.

At 504, the plurality of conductive layers 114 are deposited in, on, or about all or a portion of the semiconductor substrate 102. Each of the plurality of conductive layers 114 may include one or more conductive materials such as one or more metals or metal containing alloys, one or more conductive polymers (e.g., one or more graphene containing alloys), or combinations thereof. In some implementations, each of the plurality of conductive layers may have the same composition. In some implementations, the plurality of conductive layers may include layers having at least two different compositions. In some implementations, each of the plurality of conductive layers 114 may have the same physical configuration. In some implementations, the plurality of conductive layers may include layers having different physical configurations (e.g., different areas, thickness, or combinations thereof).

The conductive layers 114 may be deposited using any system or method or combination of systems and methods capable of providing a conductive layer 114. In some implementations, the conductive layer 114 may be patterned on at least a portion of at least one of an underlying dielectric layer 116 or an underlying composite magnetic resin layer 112. In some implementations, the conductive layer 114 may be photolithographically patterned on at least a portion of at least one of an underlying dielectric layer 116 or an underlying composite magnetic resin layer 112. In some implementations, the conductive layers may be electroplated or electro-less plated on at least a portion of at least one of an underlying dielectric layer 116 or an underlying conductive layer 114. In some implementations, the conductive layers 114 may be deposited using printing or similar deposition processes.

At 506, a composite magnetic resin layer 112 is disposed at least partially between each of the plurality of conductive layers 114 to form a composite magnetic inductor 110 in which the composite magnetic resin layers 112 interleave with the plurality of conductive layers 114. In some implementations, each of the composite magnetic resin layers 112 may have the same composition. In some implementations, at least some of the composite magnetic resin layers 112 may have different compositions. In some implementations, each of the composite magnetic resin layers 112 may have the same physical configuration. In some implementations, the composite magnetic resin layers 112 may include layers having different physical configurations (e.g., different areas, thickness, or combinations thereof).

The composite magnetic resin layers 112 may be deposited using any system or method or combination of systems and methods. In some implementations, the composite magnetic resin layer 112 may be patterned on at least a portion of at least one of an underlying dielectric layer 116 or an underlying conductive layer 114. In some implementations, the composite magnetic resin layer 112 may be photolithographically patterned on at least a portion of at least one of an underlying dielectric layer 116 or an underlying conductive layer 114. In some implementations, the composite magnetic resin layer 112 may be deposited or otherwise patterned using printing or similar deposition processes. In some implementations, the composite magnetic resin layer 112 may be applied as a liquid and spin coated across all or a portion of at least one of an underlying dielectric layer 116 or an underlying conductive layer 114. The method 500 concludes at 508.

Figure 6:
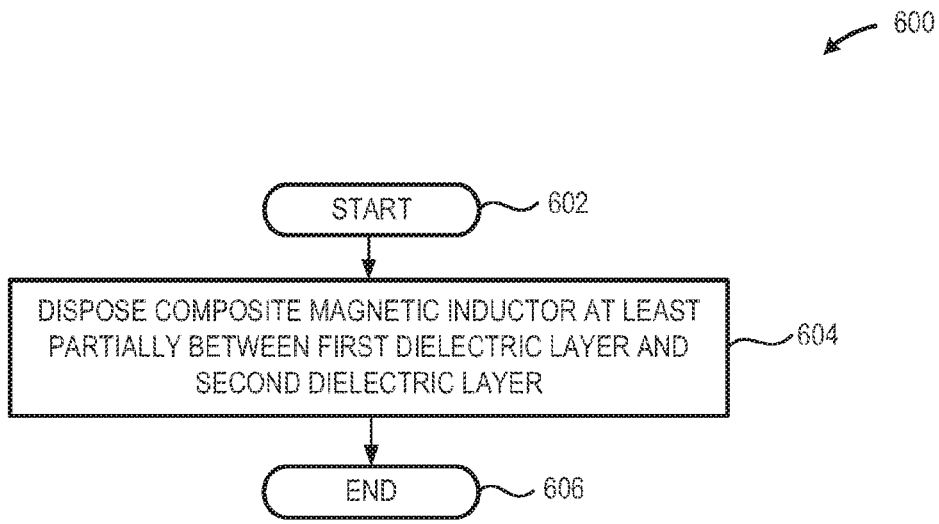
FIG. 6 is a high-level logic flow diagram of an illustrative method of fabricating a composite magnetic inductor for use in a semiconductor package that may be used in conjunction with the method of FIG. 5, in accordance with at least one embodiment described herein.

FIG. 6 is a high-level logic flow diagram of an illustrative method 600 of fabricating a composite magnetic inductor 110 for use in a semiconductor package 100, in accordance with at least one embodiment described herein. The method 600 may be used in conjunction with the method 500 described in detail above in FIG. 5. The method 600 commences at 602.

At 604, the alternating composite magnetic resin layers 112 and conductive layers 114 are disposed between a first dielectric layer 116A and a second dielectric layer 116B. In some implementations, at least one of a composite magnetic resin layer 112 or a conductive layer 114 may be formed or otherwise disposed, in whole or in part, across at least a portion of the first dielectric layer 116A. In some implementations, at least one of a composite magnetic resin layer 112 or a conductive layer 114 may be formed or otherwise disposed, in whole or in part, across at least a portion of the second dielectric layer 116B. In such embodiments, the composite magnetic inductor 110 may include a series of alternating composite magnetic resin layers 112 and conductive layers 114 disposed between the first dielectric layer 116A and the second dielectric layer 116B. The method 600 concludes at 606.

Figure 7:
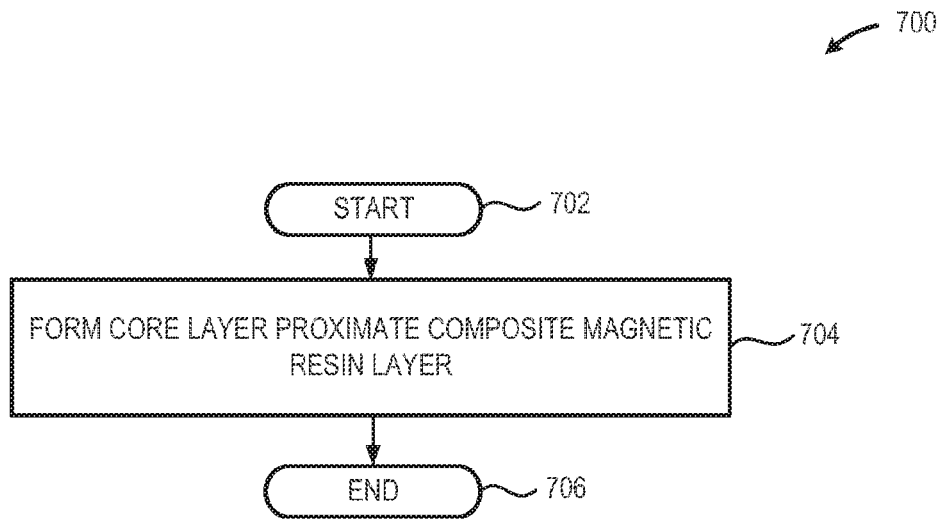
FIG. 7 is a high-level logic flow diagram of an illustrative method of fabricating a composite magnetic inductor for use in a semiconductor package that may be used in conjunction with the method of FIGS. 5 and 6, in accordance with at least one embodiment described herein.

FIG. 7 is a high-level logic flow diagram of an illustrative method 700 of fabricating a composite magnetic inductor 110 for use in a semiconductor package 100, in accordance with at least one embodiment described herein. The method 700 may be used in conjunction with the method 500 described in detail above in FIG. 5 and/or the method 600 described in detail above in FIG. 6. The method 700 commences at 702.

At 704, a core layer 120 may be disposed or otherwise formed proximate the composite magnetic inductor 110. The core layer 120 may include one or more materials that improve the rigidity and/or other physical properties of the semiconductor substrate 102. In at least some implementations, the core layer 120 may include one or more reinforcing materials, such as glass fibers, disposed within a carrier or matrix, such as a epoxy resin or similar. In embodiments, the core layer 120 may be disposed across at least a portion of the first dielectric layer 116A. In other embodiments, the core layer 120 may be disposed across at least a portion of the second dielectric layer 116B. The core layer 120 may be applied or otherwise disposed across all or a portion of the composite magnetic inductor 110 using any currently known and/or future developed deposition technique. For example, the core layer 120 may be applied as a liquid and spin coated across all or a portion of the composite magnetic inductor 110. In another example, the core layer 120 may be sprayed or printed, such as by inkjet printing, across all or a portion of the composite magnetic inductor 110. The method 700 concludes at 706.

Figure 8:
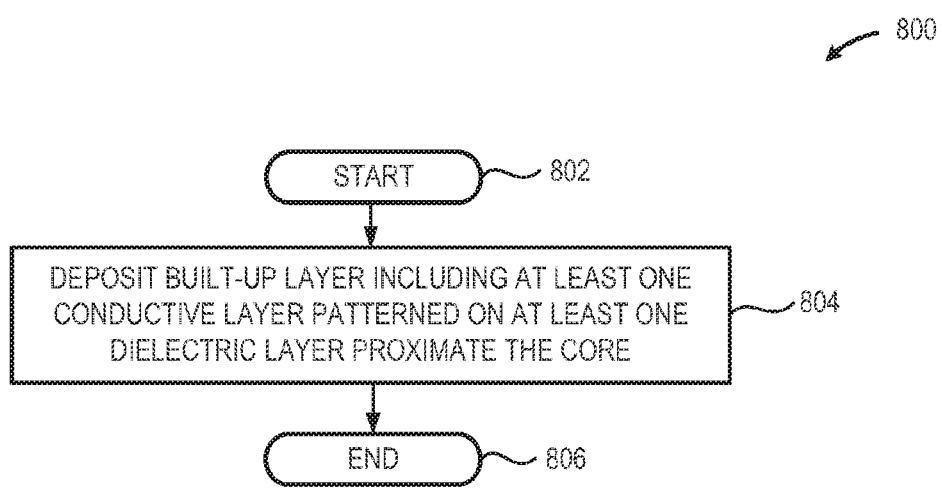
FIG. 8 is a high-level logic flow diagram of an illustrative method of fabricating a composite magnetic inductor for use in a semiconductor package that may be used in conjunction with the method of FIGS. 5, 6, and 7, in accordance with at least one embodiment described herein.

FIG. 8 is a high-level logic flow diagram of an illustrative method 800 of fabricating a composite magnetic inductor 110 for use in a semiconductor package 100, in accordance with at least one embodiment described herein. The method 800 may be used in conjunction with the method 500 described in detail above in FIG. 5, the method 600 described in detail above in FIG. 6, and/or the method 700 described in detail above in FIG. 7. The method 800 commences at 802.

At 804, a built-up layer 130 may be formed, patterned, or otherwise deposited on or across at least a portion of at least one of: the composite magnetic inductor 110 or the core layer 120, in accordance with at least one embodiment described herein. In some implementations, the built-up layer 130 may include at least one conductive layer 330 patterned or otherwise deposited on at least one dielectric layer 320. In some implementations, the built-up layer 130 may include any number of dielectric layers 320 and/or conductive layers 330. In some implementations, the built-up layer 130 may include a number of electrically conductive lands to facilitate the communicable coupling of a semiconductor die 140 to the semiconductor substrate 102, for example via a ball-grid array. The built-up layer 130 may be patterned or deposited using any number of currently known or future developed deposition technologies. In implementations, the one or more conductive layers 330 may include one or more electrically conductive metals, metal alloys, or conductive polymers. In implementations, the dielectric layers 320 may include materials such as a glass epoxy having a dielectric constant suitable for the operating frequency of the semiconductor substrate 102. In embodiments, the conductive layers 330 may be patterned onto the dielectric layer 320 using any known or future developed technique, such as via photolithography or printing using conductive inks. In embodiments, the dielectric layers 320 may be applied, deposited, or otherwise formed using any known or future developed technique, for example via spin coating, spray deposition, or similar processes. The method 800 concludes at 806.

While FIGS. 5, 6, 7, and 8 illustrate various operations according to one or more embodiments, it is to be understood that not all of the operations depicted in FIGS. 5, 6, 7, and 8 are necessary for other embodiments. Indeed, it is fully contemplated herein that in other embodiments of the present disclosure, the operations depicted in FIGS. 5, 6, 7, and 8, and/or other operations described herein, may be combined in a manner not specifically shown in any of the drawings, but still fully consistent with the present disclosure. Thus, claims directed to features and/or operations that are not exactly shown in one drawing are deemed within the scope and content of the present disclosure.

As used in this application and in the claims, a list of items joined by the term "and/or" can mean any combination of the listed items. For example, the phrase "A, B and/or C" can mean A; B; C; A and B; A and C; B and C; or A, B and C. As used in this application and in the claims, a list of items joined by the term "at least one of" can mean any combination of the listed terms. For example, the phrases "at least one of A, B or C" can mean A; B; C; A and B; A and C; B and C; or A, B and C.

As used in any embodiment herein, the terms "system" or "module" may refer to, for example, software, firmware and/or circuitry configured to perform any of the aforementioned operations. Software may be embodied as a software package, code, instructions, instruction sets and/or data recorded on non-transitory computer readable storage mediums. Firmware may be embodied as code, instructions or instruction sets and/or data that are hard-coded (e.g., non-volatile) in memory devices. "Circuitry", as used in any embodiment herein, may comprise, for example, singly or in any combination, hardwired circuitry, programmable circuitry such as computer processors comprising one or more individual instruction processing cores, state machine circuitry, and/or firmware that stores instructions executed by programmable circuitry or future computing paradigms including, for example, massive parallelism, analog or quantum computing, hardware embodiments of accelerators such as neural net processors and non-silicon implementations of the above. The circuitry may, collectively or individually, be embodied as circuitry that forms part of a larger system, for example, an integrated circuit (IC), system on-chip (SoC), desktop computers, laptop computers, tablet computers, servers, smartphones, etc.

Any of the operations described herein may be implemented in a system that includes one or more mediums (e.g., non-transitory storage mediums) having stored therein, individually or in combination, instructions that when executed by one or more processors perform the methods. Here, the processor may include, for example, a server CPU, a mobile device CPU, and/or other programmable circuitry. Also, it is intended that operations described herein may be distributed across a plurality of physical devices, such as processing structures at more than one different physical location. The storage medium may include any type of tangible medium, for example, any type of disk including hard disks, floppy disks, optical disks, compact disk read-only memories (CD-ROMs), compact disk rewritables (CD-RWs), and magneto-optical disks, semiconductor devices such as read-only memories (ROMs), random access memories (RAMs) such as dynamic and static RAMs, erasable programmable read-only memories (EPROMs), electrically erasable programmable read-only memories (EEPROMs), flash memories, Solid State Disks (SSDs), embedded multimedia cards (eMMCs), secure digital input/output (SDIO) cards, magnetic or optical cards, or any type of media suitable for storing electronic instructions. Other embodiments may be implemented as software executed by a programmable control device.

Thus, the present disclosure is directed to systems and methods for providing semiconductor substrate integrated composite magnetic inductors. The use of composite magnetic inductors beneficially eliminates the need for coupling external inductors to semiconductor substrates. Given the increasingly the tight dimensions of semiconductor packages, the ability to attach large inductors to such packages is limited. Thus, a significant advantage exists in being able to incorporate a composite magnetic inductor directly in the semiconductor substrate of a semiconductor package. Further, the inductance of such composite magnetic inductors exceeds the inductance of external inductors, thereby providing an additional benefit. The composite magnetic inductor includes a stack of alternating conductive layers and composite magnetic resin layers. The composite magnetic resin layers include one or more magnetic materials suspended or otherwise disposed in a binder such as an epoxy resin. The semiconductor substrate may include the composite magnetic inductor, a core, and a built-up layer to which the semiconductor die couples.

The following examples pertain to further embodiments. The following examples of the present disclosure may comprise subject material such as at least one device, a method, at least one machine-readable medium for storing instructions that when executed cause a machine to perform acts based on the method, means for performing acts based on the method and/or a system for providing an integral composite magnetic inductor in a semiconductor substrate.

According to example 1, there is provided a semiconductor substrate. The semiconductor substrate may include: at least one composite magnetic inductor that may include: at least one composite magnetic resin layer; a plurality of conductive layers disposed on opposite side of the at least one magnetic resin layer; where the at least one magnetic resin layer and the plurality of conductive layers are interleaved to provide the at least one composite magnetic inductor in which the at least one composite magnetic resin layer alternates with the plurality of conductive layers.

Example 2 may include elements of example 1 and the semiconductor substrate may additionally include a first dielectric layer disposed proximate a first surface portion of the at least one composite magnetic inductor and a second dielectric layer disposed proximate a second surface portion of the at least one composite magnetic inductor, the second surface portion of the at least one composite magnetic inductor opposed across the composite magnetic inductor from the first surface portion.

Example 3 may include elements of example 1, and the semiconductor substrate may additionally include at least one built-up layer.

Example 4 may include elements of example 3 where the at least one built-up layer may include at least one built-up layer disposed proximate at least a portion of the at least one inductor.

Example 5 may include elements of example 4 where the at least one built-up layer may form at least a portion of the top layer of the semiconductor substrate and the at least one inductor forms at least a portion of the bottom of the semiconductor substrate.

Example 6 may include elements of example 5, and the semiconductor substrate may additionally include a core layer disposed between the at least one built up layer and the at least one inductor.

Example 7 may include elements of example 5 where the at least one built-up layer may include a plurality of lands to accept the communicable coupling of at least one semiconductor die.

Example 8 may include elements of example 7 where the at least one composite magnetic inductor may include a plurality of lands to accept the communicable coupling to a motherboard.

Example 9 may include elements of any of examples 1 through 8 where the composite magnetic resin layer includes a resin selected from the group consisting of: thermoset epoxies; inter-penetrating polymer networks; liquid crystalline polymers (LCP); fluoropolymers; and silicones.

Example 10 may include elements of example 9 where the thermoset epoxy comprises bisbenzocyclobutene (BCB).

Example 11 may include elements of example 9 where the composite magnetic resin includes at least one of: a metallic magnetic material or a soft ferrite magnetic material.

Example 12 may include elements of example 11 where the metallic magnetic material is selected from the group consisting of: Fe, oriented FeSi, unoriented FeSi, FeNi, FeCo, FeSiBNbCu, and CoZrTa.

Example 13 may include elements of example 11 where the soft ferrite magnetic material is selected from the group consisting of: MnZn, NiZn, and $Fe_2O_3$.

According to example 14, there is provided a motherboard. The motherboard may include: a semiconductor package communicably coupled to the motherboard, the semiconductor package having at least one composite magnetic inductor that includes: at least one composite magnetic resin layer; and a plurality of conductive layers disposed on opposite side of the at least one composite magnetic resin layer; where the at least one magnetic resin layer and the plurality of conductive layers are interleaved to provide the at least one composite magnetic inductor, the at least one composite magnetic inductor including alternating conductive layers and composite magnetic resin layers.

Example 15 may include elements of example 14, and the motherboard may additionally include a first dielectric layer disposed proximate a first surface portion of the at least one composite magnetic inductor; and a second dielectric layer disposed proximate a second surface portion of the at least one composite magnetic inductor, the second surface portion of the stack opposed across the at least one composite magnetic inductor from the first surface portion.

Example 16 may include elements of example 15 where the semiconductor substrate may further include at least one built-up layer.

Example 17 may include elements of example 16 where the at least one built-up layer comprises at least one built-up layer disposed proximate at least a portion of the at least one composite magnetic inductor.

Example 18 may include elements of example 17 where the at least one built-up layer forms at least a portion of the top layer of the semiconductor substrate and the at least one inductor forms at least a portion of the bottom of the semiconductor substrate.

Example 19 may include elements of example 18 where the composite magnetic inductor may further include a core layer disposed between the at least one built up layer and the at least one inductor.

Example 20 may include elements of example 18 where the at least one built-up layer includes a plurality of lands to accept the communicable coupling of at least one semiconductor die.

Example 21 may include elements of example 20 where the at least one composite magnetic inductor includes a plurality of lands to accept the communicable coupling to a motherboard.

Example 22 may include elements of any of examples 14 through 21 where the composite magnetic resin includes a resin selected from the group consisting of: thermoset epoxies; inter-penetrating polymer networks; liquid crystalline polymers (LCP); fluoropolymers; and silicones.

Example 23 may include elements of example 22 where the thermoset epoxy comprises bisbenzocyclobutene (BCB).

Example 24 may include elements of example 22 where the composite magnetic resin includes at least one of: a metallic magnetic material or a soft ferrite magnetic material.

Example 25 may include elements of example 24 where the metallic magnetic material is selected from the group consisting of: Fe, oriented FeSi, unoriented FeSi, FeNi, FeCo, FeSiBNbCu, and CoZrTa.

Example 26 may include elements of example 24 where the soft ferrite magnetic material is selected from the group consisting of: MnZn, NiZn, and $Fe_2O_3$.

According to example 27, there is provided a method of forming a composite magnetic inductor in a semiconductor substrate. The method may include: depositing a plurality of conductive layers within the semiconductor substrate; and depositing a composite magnetic resin layer between each of at least some of the conductive layers included in the plurality of conductive layers to provide the composite magnetic inductor in which the composite magnetic resin layer alternates with the conductive layer.

Example 28 may include elements of example 27, and the method may additionally include disposing the composite magnetic inductor at least partially between a first dielectric layer and a second dielectric layer, such that the composite magnetic inductor is sandwiched at least partially between at least a portion of the first dielectric layer and at least a portion of the second.

Example 29 may include elements of example 28, and the method may additionally include forming a core layer proximate at least a portion of the integral magnetic layer.

Example 30 may include elements of example 29, and the method may further include depositing a top built-up layer proximate at least a portion of the core layer, the top built-up layer including at least one conductive layer patterned on at least one dielectric layer.

Example 31 may include elements of example 30 where depositing a top built-up layer may include depositing a top built-up layer that includes a plurality of lands to accept the communicable coupling of at least one semiconductor die.

Example 32 mat include elements of example 28 where disposing the composite magnetic inductor at least partially between a first dielectric layer and a second dielectric layer may include: disposing the composite magnetic inductor at least partially between a first dielectric layer and a second dielectric layer, wherein at least one of the first dielectric layer or the second dielectric layer includes a plurality of lands to communicably couple the semiconductor substrate to a motherboard.

Example 33 may include elements of any of examples 27 through 32 where depositing a composite magnetic resin layer between each of at least some of the conductive layers included in the plurality of conductive layers may include: depositing a composite magnetic resin layer that includes a resin selected from the group consisting of: thermoset epoxies; inter-penetrating polymer networks; liquid crystalline polymers (LCP); fluoropolymers; and silicones between each of at least some of the conductive layers included in the plurality of conductive layers.

Example 34 may include elements of example 33 where depositing a composite magnetic resin layer that includes a thermoset epoxy resin between each of at least some of the conductive layers included in the plurality of conductive layers may include depositing a composite magnetic resin layers that includes a bisbenzocyclobutene (BCB) thermoset epoxy resin between each of at least some of the conductive layers included in the plurality of conductive layers.

Example 35 may include elements of example 27 where depositing a composite magnetic resin layer between each of at least some of the conductive layers included in the plurality of conductive layers may include depositing a composite magnetic resin layer that includes at least one of: a metallic magnetic material or a soft ferrite magnetic material between each of at least some of the conductive layers included in the plurality of conductive layers.

Example 36 may include elements of example 35 where depositing a composite magnetic resin layer that includes a metallic magnetic material between each of at least some of the conductive layers included in the plurality of conductive layers may include depositing a composite magnetic resin layer that includes a metallic magnetic material selected from the group consisting of: Fe, oriented FeSi, unoriented FeSi, FeNi, FeCo, FeSiBNbCu, and CoZrTa between each of at least some of the conductive layers included in the plurality of conductive layers.

Example 37 may include elements of example 35 where depositing a composite magnetic resin layer that includes a soft ferrite magnetic material between each of at least some of the conductive layers included in the plurality of conductive layers comprises: depositing a composite magnetic resin layer that includes a soft ferrite magnetic material selected from the group consisting of: MnZn, NiZn, and $Fe_2O_3$ between each of at least some of the conductive layers included in the plurality of conductive layers.

According to example 38, there is provided a system to form a composite magnetic inductor in a semiconductor substrate. The system may include: means for depositing a plurality of conductive layers within the semiconductor substrate; and means for means for depositing a composite magnetic resin layer between each of at least some of the conductive layers included in the plurality of conductive layers to provide the composite magnetic inductor in which the composite magnetic resin layer alternates with the conductive layer.

Example 39 may include elements of example 38, and the system may additionally include: means for disposing the composite magnetic inductor at least partially between a first dielectric layer and a second dielectric layer, such that the composite magnetic inductor is sandwiched between at least a portion of the first dielectric layer and at least a portion of the second dielectric layer.

Example 40 may include elements of example 39, and the system may additionally include: means for forming a core layer proximate at least a portion of the composite magnetic inductor.

Example 41 may include elements of example 40, and the system may additionally include: means for depositing a top built-up layer proximate at least a portion of the core layer, the top built-up layer including at least one conductive layer patterned on at least one dielectric layer.

The terms and expressions which have been employed herein are used as terms of description and not of limitation, and there is no intention, in the use of such terms and expressions, of excluding any equivalents of the features shown and described (or portions thereof), and it is recognized that various modifications are possible within the scope of the claims. Accordingly, the claims are intended to cover all such equivalents.

What is claimed is:

1. A semiconductor substrate, comprising:
    at least one composite magnetic inductor that includes:
        at least one composite magnetic resin layer; and
        a plurality of conductive layers disposed on opposing sides of the at least one composite magnetic resin layer, wherein the at least one composite magnetic resin layer and the plurality of conductive layers are interleaved to provide the at least one composite magnetic inductor in which the at least one composite magnetic resin layer alternates with conductive layers included in the plurality of conductive layers; and
        a conductive via extending through an opening in the at least one composite magnetic resin layer and the plurality of conductive layers, wherein the at least one composite magnetic resin layer and the plurality of conductive layers completely laterally surround the conductive via.

2. The semiconductor substrate of claim 1, further comprising:
    a first dielectric layer disposed proximate a first surface portion of the at least one composite magnetic inductor; and
    a second dielectric layer disposed proximate a second surface portion of the at least one composite magnetic inductor, the second surface portion of the at least one composite magnetic inductor in opposition, across the composite magnetic inductor, to the first surface portion.

3. The semiconductor substrate of claim 1, further comprising at least one built-up layer.

4. The semiconductor substrate of claim 3 wherein the at least one built-up layer comprises at least one built-up layer disposed proximate at least a portion of the at least one composite magnetic inductor.

5. The semiconductor substrate of claim 4 wherein the at least one built-up layer forms at least a portion of the top layer of the semiconductor substrate and the at least one composite magnetic inductor forms at least a portion of the bottom of the semiconductor substrate.

6. The semiconductor substrate of claim 5, further comprising a core layer disposed between the at least one built up layer and the at least one composite magnetic inductor.

7. The semiconductor substrate of claim 5 wherein the at least one built-up layer includes a plurality of lands to accept the communicable coupling of at least one semiconductor die.

8. The semiconductor substrate of claim 7 wherein the at least one composite magnetic inductor includes a plurality of lands to accept the communicable coupling to a motherboard.

9. The semiconductor substrate of claim 1 wherein the composite magnetic resin layer comprises a magnetic resin that includes a resin selected from the group consisting of: thermoset epoxies; inter-penetrating polymer networks; liquid crystalline polymers (LCP); fluoropolymers; and silicones.

10. The semiconductor substrate of claim 9 wherein the composite magnetic resin layer comprises a thermoset epoxy that includes bisbenzocyclobutene (BCB).

11. The semiconductor substrate of claim 9 wherein the composite magnetic resin layer comprises a magnetic resin that includes at least one of: a metallic magnetic material or a soft ferrite magnetic material.

12. The semiconductor substrate of claim 11 wherein the metallic magnetic material is selected from the group consisting of: Fe, oriented FeSi, unoriented FeSi, FeNi, FeCo, FeSiBNbCu, and CoZrTa.

13. The semiconductor substrate of claim 11 wherein the soft ferrite magnetic material is selected from the group consisting of: MnZn, NiZn, and $Fe_2O_3$.

14. A method of forming a semiconductor substrate that includes a composite magnetic inductor, the method comprising:
    depositing a plurality of conductive layers within the semiconductor substrate;
    depositing a composite magnetic resin layer between each of at least some of the conductive layers included in the plurality of conductive layers to provide the composite magnetic inductor in which the composite magnetic resin layer alternates with the plurality of conductive layers; and
    forming a conductive via extending through an opening in the plurality of conductive layers and the composite magnetic resin layer, wherein the composite magnetic resin layer and the plurality of conductive layers completely laterally surround the conductive via.

15. The method of claim 14, further comprising:
    disposing the composite magnetic inductor at least partially between a first dielectric layer and a second dielectric layer, such that the composite magnetic inductor is sandwiched between at least a portion of the first dielectric layer and at least a portion of the second dielectric layer.

16. The method of claim 15, further comprising:
    forming a core layer proximate at least a portion of the composite magnetic inductor.

17. The method of claim 16 further comprising:
    depositing a top built-up layer proximate at least a portion of the core layer, the top built-up layer including at least one conductive layer patterned on at least one dielectric layer.

18. The method of claim 17 wherein depositing a top built-up layer comprises:
    depositing a top built-up layer that includes a plurality of lands to accept the communicable coupling of at least one semiconductor die.

19. The method of claim 15 wherein disposing the composite magnetic inductor at least partially between a first dielectric layer and a second dielectric layer comprises:
    disposing the composite magnetic inductor at least partially between a first dielectric layer and a second dielectric layer, wherein at least one of the first dielectric layer or the second dielectric layer includes a plurality of lands to communicably couple the semiconductor substrate to a motherboard.

20. The method of claim 19 wherein depositing a composite magnetic resin layer between each of at least some of the conductive layers included in the plurality of conductive layers comprises:
    depositing a composite magnetic resin layer comprising a composite magnetic resin that includes a resin selected from the group consisting of: thermoset epoxies; inter-penetrating polymer networks; liquid crystalline polymers (LCP); fluoropolymers; and silicones between each of at least some of the conductive layers included in the plurality of conductive layers.

21. The method of claim 20 wherein depositing a composite magnetic resin layer comprising a composite magnetic resin that includes a thermoset epoxy resin between each of at least some of the conductive layers included in the plurality of conductive layers comprises:
  depositing a composite magnetic resin layer that includes a bisbenzocyclobutene (BCB) thermoset epoxy resin between each of at least some of the conductive layers included in the plurality of conductive layers.

22. The method of claim 14 wherein depositing a composite magnetic resin layer between each of at least some of the conductive layers included in the plurality of conductive layers comprises:
  depositing a composite magnetic resin layer comprising a composite magnetic resin that includes at least one of: a metallic magnetic material or a soft ferrite magnetic material between each of at least some of the conductive layers included in the plurality of conductive layers.

23. The method of claim 22 wherein depositing a composite magnetic resin layer comprising a composite magnetic resin that includes a metallic magnetic material between each of at least some of the conductive layers included in the plurality of conductive layers comprises:
  depositing a composite magnetic resin layer comprising a composite magnetic resin that includes a metallic magnetic material selected from the group consisting of: Fe, oriented FeSi, unoriented FeSi, FeNi, FeCo, FeSiBNbCu, and CoZrTa between each of at least some of the conductive layers included in the plurality of conductive layers.

24. The method of claim 23 wherein depositing a composite magnetic resin layer comprising a composite magnetic resin that includes a soft ferrite magnetic material between each of at least some of the conductive layers included in the plurality of conductive layers comprises:
  depositing a composite magnetic resin layer comprising a composite magnetic resin that includes a soft ferrite magnetic material selected from the group consisting of:
  MnZn, NiZn, and $Fe_2O_3$ between each of at least some of the conductive layers included in the plurality of conductive layers.

25. A system to form a semiconductor substrate that includes a composite magnetic inductor, the system comprising:
  means for depositing a plurality of conductive layers within the semiconductor substrate;
  means for depositing a composite magnetic resin layer between each of at least some of the conductive layers included in the plurality of conductive layers to provide the composite magnetic inductor in which the composite magnetic resin layer alternates with the plurality of conductive layers; and
  forming a conductive via extending through an opening in the plurality of conductive layers and the composite magnetic resin layer, wherein the composite magnetic resin layer and the plurality of conductive layers completely laterally surround the conductive via.

* * * * *